(12) United States Patent
Giraudin et al.

(10) Patent No.: US 7,667,292 B2
(45) Date of Patent: Feb. 23, 2010

(54) INTEGRATED CIRCUIT COMPRISING AT LEAST ONE CAPACITOR AND PROCESS FOR FORMING THE CAPACITOR

(75) Inventors: Jean-Christophe Giraudin, Bemin (FR); Vincent Fiori, Sassenage (FR); Philippe Delpech, Meylan (FR)

(73) Assignees: STMicroelectronics S.A., Montrouge (FR); STMicroelectronics (Crolles 2) SAS, Crolles (FR)

( * ) Notice: Subject to any disclaimer, the term of this patent is extended or adjusted under 35 U.S.C. 154(b) by 85 days.

(21) Appl. No.: 11/415,393

(22) Filed: May 1, 2006

(65) Prior Publication Data

US 2006/0255427 A1 Nov. 16, 2006

(30) Foreign Application Priority Data

May 4, 2005 (FR) .................................. 05 04536

(51) Int. Cl.
*H01L 27/08* (2006.01)
(52) U.S. Cl. ................................. 257/532; 257/E27.048
(58) Field of Classification Search ................. 257/301, 257/E21.396, E29.346
See application file for complete search history.

(56) References Cited

U.S. PATENT DOCUMENTS

| 5,216,267 | A | | 6/1993 | Jin et al. | |
|---|---|---|---|---|---|
| 5,364,809 | A | | 11/1994 | Kwon et al. | |
| 5,604,696 | A | * | 2/1997 | Takaishi | 365/149 |
| 5,677,225 | A | | 10/1997 | Park et al. | |
| 6,097,053 | A | | 8/2000 | Ando et al. | |
| 6,140,207 | A | * | 10/2000 | Lee | 438/427 |
| 6,723,600 | B2 | * | 4/2004 | Wong et al. | 438/244 |
| 6,750,495 | B1 | | 6/2004 | Alers et al. | |
| 6,765,255 | B2 | * | 7/2004 | Jin et al. | 257/301 |
| 6,992,344 | B2 | * | 1/2006 | Coolbaugh et al. | 257/301 |
| 2002/0185671 | A1 | * | 12/2002 | Kim | 257/301 |
| 2003/0062558 | A1 | | 4/2003 | Yang et al. | |
| 2003/0123216 | A1 | | 7/2003 | Yoon et al. | |
| 2003/0232483 | A1 | * | 12/2003 | Fujiishi | 438/396 |
| 2004/0245558 | A1 | | 12/2004 | Manger | |

OTHER PUBLICATIONS

Preliminary Search Report, FR 05 04536, dated Dec. 14, 2005.

* cited by examiner

*Primary Examiner*—Sue Purvis
*Assistant Examiner*—Benjamin P Sandvik
(74) *Attorney, Agent, or Firm*—Gardere Wynne Sewell LLP

(57) ABSTRACT

An integrated circuit includes at least one capacitor that is formed on a layer provided with at least one first trench. The capacitor, which is provided with a dielectric layer that separates two electrodes, conforms to the shape of the first trench, but leaves a part of the first trench unfilled. A material capable of absorbing stresses associated with the displacements of the walls of the trench is placed in the trench to fill the part of the first trench. A second trench is formed at least partly surrounding the first trench. This second trench is also at least partly filled with a material capable of absorbing stresses associated with the displacements of the walls of the second trench. A void may be included in the stress absorbing material which fills either of the first or second trenches.

21 Claims, 7 Drawing Sheets

INTEGRATED CIRCUIT COMPRISING AT LEAST ONE CAPACITOR AND PROCESS FOR FORMING THE CAPACITOR

PRIORITY CLAIM

The present application claims priority from French Application for Patent No. 05 04536 filed May 4, 2005, the disclosure of which is hereby incorporated by reference.

BACKGROUND OF THE INVENTION

1. Technical Field of the Invention

The present invention relates to the formation of capacitors within an integrated circuit.

2. Description of Related Art

In integrated circuits, and especially radiofrequency integrated circuits, the capacitors occupy a very large area, hence a high cost. Thus, there is a need to increase the capacitance per unit area of these capacitors, while still maintaining the performance requirements for radiofrequency applications.

To do this, it is known to form capacitors in three dimensions in trenches or wells, thereby enabling the surface density of the electrodes to be increased.

However, it is found that, with this process, the mechanical stresses on the materials used to form the capacitors cause considerable debonding, especially from the walls of the trenches. These stresses, which are exerted on the dielectric layer of the capacitors, may lead to degradation in the electrical performance of the circuit. Thus, they may induce premature breakdown of the capacitors or an increase in the leakage currents.

SUMMARY OF THE INVENTION

It is possible to remedy the foregoing and other drawbacks by forming the capacitor in the trench so as to leave a part of the trench behind and by placing, in this part of the trench, a material capable of absorbing the stresses associated with the displacements of the walls of the trench.

This particular circuit structure to a large extent prevents debonding of the capacitors in the integrated circuit and allows it to retain its good electrical performance.

An embodiment of the invention therefore proposes an integrated circuit comprising at least one capacitor formed on a layer provided with at least one trench, said capacitor, which is provided with a dielectric layer that separates two electrodes, conforming to the shape of the trench. Furthermore, the capacitor leaves a part of the trench behind (i.e., still in existence) and a material capable of absorbing the stresses associated with the displacements of the walls of the trench is placed in said part of the trench.

In other words, in general, a material is placed in the trenches that has the function of damping the movements of the walls of the various trenches in the integrated circuit. The material used allows the forces exerted horizontally along the circuit to be better distributed. The material is especially capable of deforming, and especially of being compressed, so as to absorb the stresses, in particular the shear stresses.

An embodiment of the invention also proposes a process for forming at least one capacitor on a layer provided with at least one trench, said capacitor, which is provided with a dielectric layer that separates two electrodes, conforming to the shape of the trench. According to the process, the capacitor is formed so as to leave a part of the trench behind and a material capable of absorbing the stresses associated with the displacements of the walls of the trench is placed in said part of the trench.

According to one embodiment, said material is a material with a Young's modulus of less than 100 GPa (i.e. less than $10^{11}$ Pa). This choice of Young's modulus allows good absorption of the stresses.

This material may especially be silicon oxide ($SiO_2$). This material may be used in other regions of the integrated circuit, and so has an economic advantage.

According to another embodiment, said material has an internal void. In this case, said material may be chosen from materials commonly used in the microelectronics industry such as $SiO_2$, metals or metal compounds, such as W, TiN and TaN, or any other insulating or conducting material. In particular, it may be chosen from materials with a Young's modulus of less than 100 GPa. The internal void in the material allows better absorption of the stresses.

According to one embodiment, the internal void is located some distance from the electrodes of the capacitor. In this way, the stresses are absorbed uniformly over the height of the trench.

The capacitor may be formed by successively depositing a first electrode, a dielectric layer and a second electrode, the successive layers being deposited so as to conform to the shape of the trench. In particular, the trench has a rectangular cross section.

The material capable of absorbing the stresses associated with the displacements of the walls of the trench may be deposited by any vapor deposition technique, and especially by PECVD (plasma-enhanced chemical vapor deposition), or by spin coating.

When the material has an internal void, this may be formed by a deposition process that allows the formation of a void, such as for example by chemical vapor deposition. The conditions may thus be chosen so as to promote the formation of surplus material in the bottom and top of the trench or so as to promote depletion of material inside the trench. For depositing W by CVD, a deposition temperature of between 410 and 430° C. may thus be chosen.

According to another embodiment, the layer on which the capacitor is formed includes an additional trench that contains a material capable of absorbing the stresses associated with the displacements of the walls of the trench, said additional trench at least partly surrounding the assembly formed by the trenches described above. The presence of this additional trench allows better absorption of the stresses.

The trenches may contain a material with a Young's modulus of less than 100 GPa and the additional trench may contain a material having an internal void. It is also conceivable for the trenches to contain a material having an internal void and for the additional trench to contain a material with a Young's modulus of less than 100 GPa.

In accordance with another embodiment, an integrated circuit comprises a first trench having walls and a floor, a metal-insulator-metal layered structure deposited along the walls and floor which leaves a part of the first trench remaining, and a stress absorbing material with a Young's modulus of less than 100 GPa filling the remaining part of the first trench.

In accordance with another embodiment, an integrated circuit comprises a plurality of first trenches having walls and a floor, a metal-insulator-metal layered structure forming a capacitor, the metal-insulator-metal layered structure deposited along the walls and floor of each of the plurality of first trenches but which leaves a part of each first trench remaining and a stress absorbing material with a Young's modulus of less than 100 GPa filling each of the remaining parts of the plurality of first trenches.

BRIEF DESCRIPTION OF THE DRAWINGS

A more complete understanding of the method and apparatus of the present invention may be acquired by reference to the following Detailed Description when taken in conjunction with the accompanying Drawings wherein:

FIGS. 1 to 3 and 5 illustrate a first embodiment;

FIGS. 4 and 6 a second embodiment corresponding to a variant of the steps illustrated in FIGS. 3 and 5;

FIGS. 7 and 8 illustrate a first variant of these two embodiments; and

FIGS. 9 to 15 illustrate a second variant of these two embodiments.

DETAILED DESCRIPTION OF THE PREFERRED EMBODIMENTS

FIGS. 1 to 13 are cross-sectional views of the integrated circuit at various steps in the process for forming the capacitor according to the invention.

Figure 1:
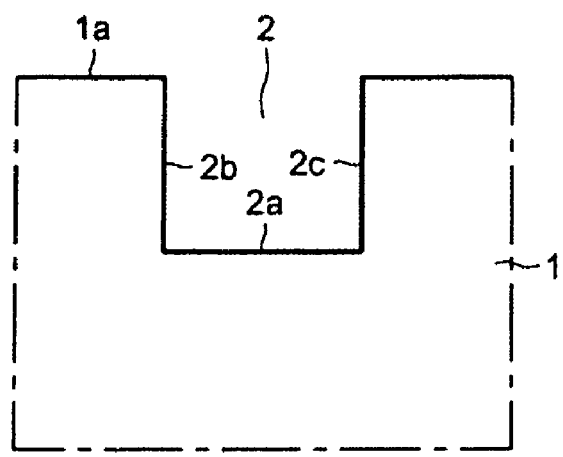
FIGS. 1 to 15 diagrammatically illustrate the main steps of two methods of implementing the process of the invention that result in two embodiments of an integrated circuit according to the invention.
Figure 2:
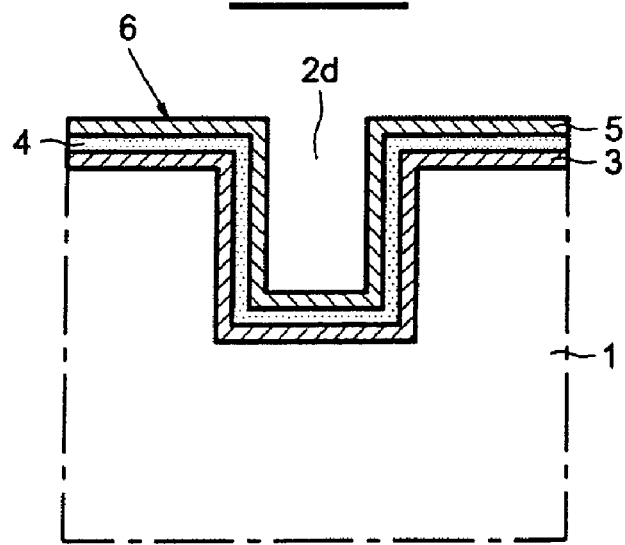
Figure 3:
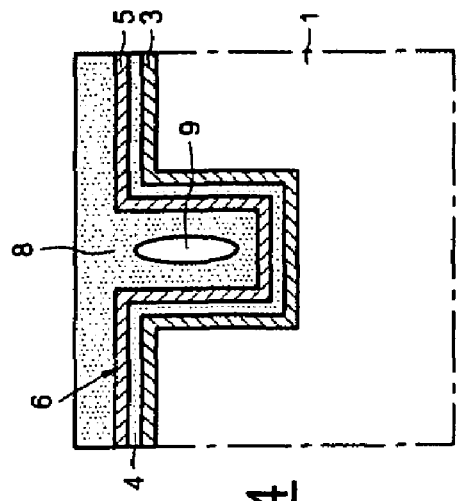
Figure 4:
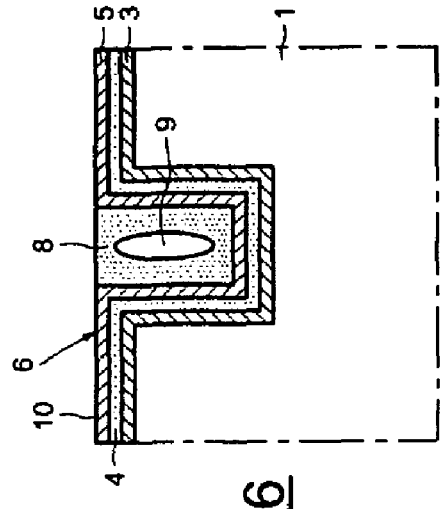

FIG. 1 shows a layer 1, which may be made of silicon, glass, $SiO_2$ or any other insulating material. The layer 1 is typically a substrate with a planar upper surface 1a. A rectangular trench 2 is etched into the layer 1, for example by dry fluorine etching. The trench 2 has a bottom 2a parallel to the planar upper surface 1a of the layer 1, and also parallel edges 2b and 2c of length generally greater than that of the bottom 2a. The depth of the trench 2 is generally between 1 and 200 μm. For example, it is possible to form trenches with a depth of between 1 and 10 μm in an interconnect region or a depth of between 10 and 100 μm in a substrate.

Next, a capacitor 6 is formed (FIG. 2) by depositing, in succession, a first electrode, in the form of a layer 3, a dielectric layer 4 and a second electrode in the form of a second layer 5. The three layers 3, 4, 5 constituting the capacitor 6 are deposited so that they conform to the shape of the trench 2. Thus, the layers 3, 4, 5 each have two portions parallel to the planar upper surface 1a of the layer 1, on each side of the trench 2, a portion parallel to the edge 2b, a portion parallel to the bottom 2a and a portion parallel to the second edge 2c of the trench 2. In this way, the layers 3, 4, 5 are substantially parallel to one another.

The electrodes are typically based on TiN, TaN or W. The dielectric may be chosen from $Al_2O_3$, $Ta_2O_5$, $HfO_2$, $SiO_2$ and SiN, or any other dielectric material, and also from combinations of these materials. The various layers 3, 4, 5 may be deposited by any technique known to those skilled in the art. The electrodes may in particular be deposited by ALD (atomic layer deposition) or by CVD (chemical vapor deposition).

Since the layers 3, 4, 5 constituting the capacitor 6 are deposited so as to conform to the shapes of the edges 2b, 2c and of the bottom 2a of the trench 2, then of course a part 2d of the trench 2 remains. In this way, it is possible to place in said part 2d of the trench 2 a material capable of absorbing the stresses associated with the displacements of the walls of the trench 2.

In a first embodiment (FIG. 3), the material capable of absorbing the stresses associated with the displacements of the walls of the trench 2 is a material 7 with a Young's modulus of less than 100 GPa, and especially between 50 and 90 GPa. Typically, the material 7 is silicon oxide deposited from tetraethylorthosilicate (TEOS), which has a Young's modulus of around 60 GPa, SiOC, or a polymer, especially a polyimide. The material 7 is preferably deposited by CVD, but it is also conceivable to deposit it by spin coating. The material 7 entirely fills the part 2d of the trench 2.

In a second embodiment (FIG. 4), the material capable of absorbing the stresses associated with the displacements of the walls of the trench 2 is a material 8 that has an internal void 9. The material 8 is deposited by a process allowing the formation of the void 9, especially by chemical vapor deposition. The material 8 may be chosen from materials than can be deposited by CVD. Typically, tungsten is used. The material 8 may also be chosen from SiOC and polymers, especially polyimides.

Preferably, the void 9 is located some distance from the electrodes 3, 5. To do this, the gas flow and gas pressure parameters during the chemical vapor deposition are adjusted so that the material 8 is deposited simultaneously in the bottom and top corners of the trench 2d. In this way, the top of the trench 2d is closed off before the core of the trench 2d has been filled with material 8.

After the material 7, 8 has been deposited, some material 7, 8 remains on the upper surface 10 of the capacitor, namely the surface consisting of the portions of the electrode 5 that are parallel to the upper surface 1a of the layer 1.

Figure 5:
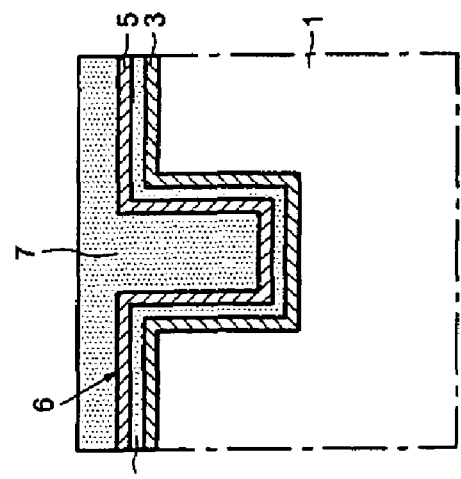
Figure 6:
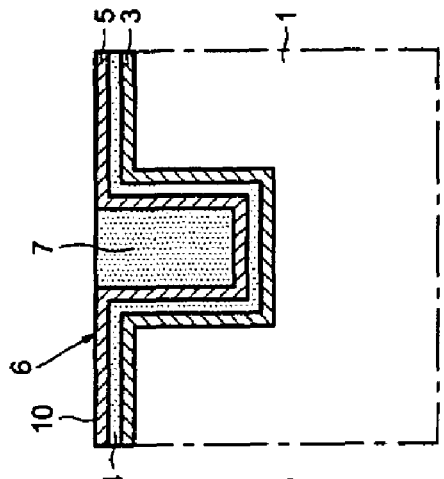

The material 7, 8 then undergoes a chemical-mechanical polishing operation so as to remove the material 7, 8 from the external surface 10 of the capacitor 6. The void 9 in the material 8 is formed beneath the upper surface of the material 8. Thanks to the chemical-mechanical polishing, the material 7, 8 remains only in the trench 2d, and the upper surface of the material 7, 8 is aligned with the upper surface 10 of the capacitor 6. This facilitates the subsequent formation of connections. FIGS. 5 and 6 illustrate the integrated circuit according to the two embodiments described above, after the chemical-mechanical polishing step.

In other words, the remaining part 2d of the trench 2 is occupied by a relatively compliant filling element, which may be insulating or conducting.

Figure 8:
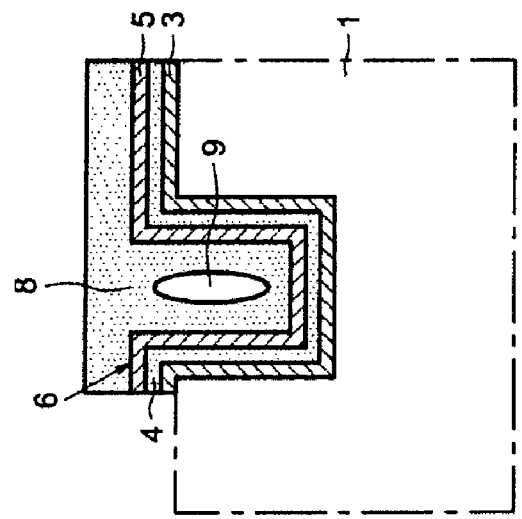
Figure 7:
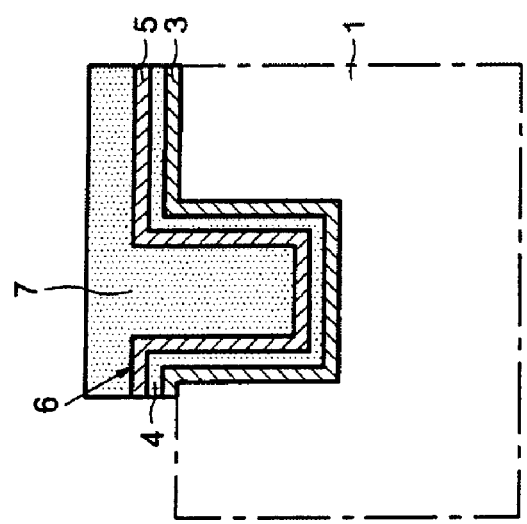

In a variant of these two embodiments, which is illustrated in FIGS. 7 and 8, the end of the capacitor 6 is etched by photolithographic etching.

Thanks to its ability to absorb the stresses, the material 7, 8 used in the process of the invention can be compressed laterally under the action of stresses. This makes the integrated circuit mechanically stable and prevents stresses from being transmitted to neighboring structures, which would then run the risk of deteriorating. In particular, it has been found that when the material 8 has an internal void 9, the mean normal stress at the bottom of the trench is substantially reduced compared with a material 7 made of tungsten not having an internal void 9 (about a 40% reduction when the layer 1 is made of silicon and about a 60% reduction when the layer 1 is made of silicon oxide).

Figure 9:
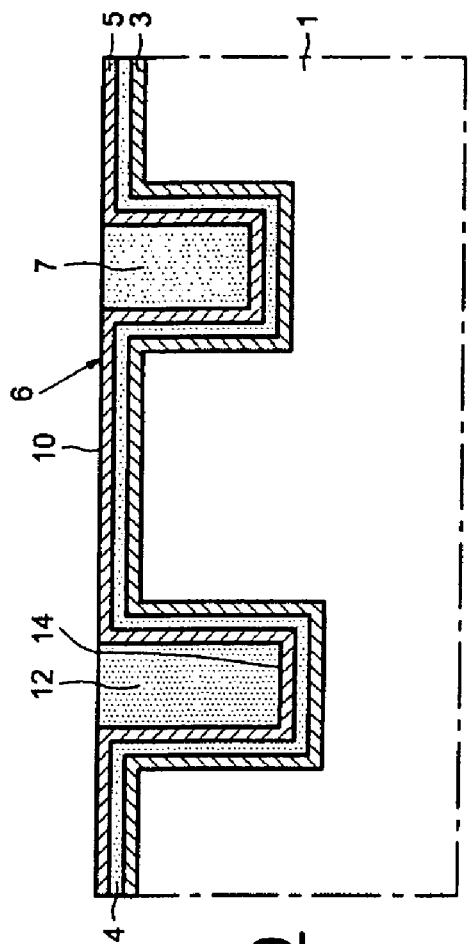
Figure 10:
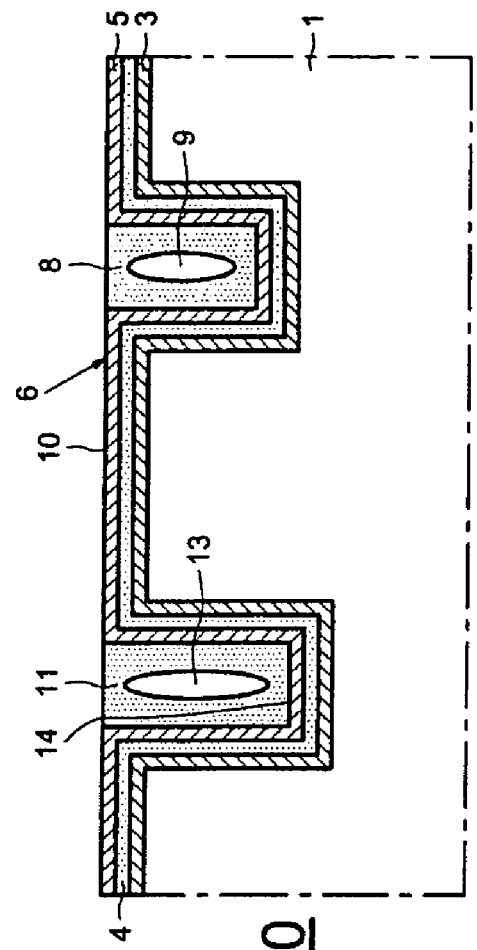

The stresses may be further reduced by employing the circuit as illustrated in FIGS. 9 and 10. An additional trench 14 is placed around the assembly formed by the trenches 2 filled with material 7, 8. The additional trench 14 is formed in the same way as the trenches 2. Like the trenches 2, it contains a material 11, 12 capable of absorbing the stresses associated with the displacements of the walls of the trench. It may have the same depth as the trenches 2 if an etching stop layer is used to form the trenches 2. In this case, the additional trench 14 may be formed using the same etching stop layer. However, preferably the additional trench 14 is deeper than the trenches 2 so as to further reduce the mechanical stresses. For this purpose, the additional trench 14 is also preferably wider. It should be noted that this embodiment requires no additional step. The material 11, 12 capable of absorbing the stresses associated with the displacements of the walls of the additional trench may be chosen, without distinction, from the materials 12 with a Young's modulus of less than 100 GPa and the materials 11 having an internal void 13 that are described above, independently of the material present in the trenches 2.

Figure 11:
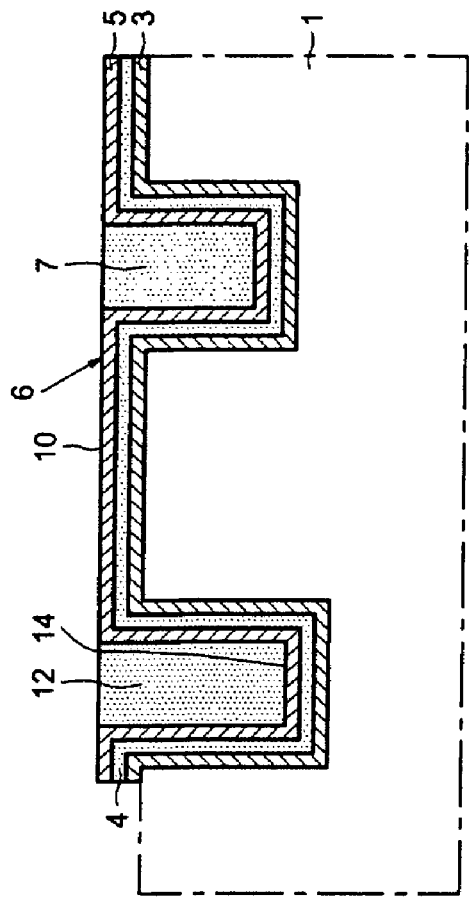
Figure 12:
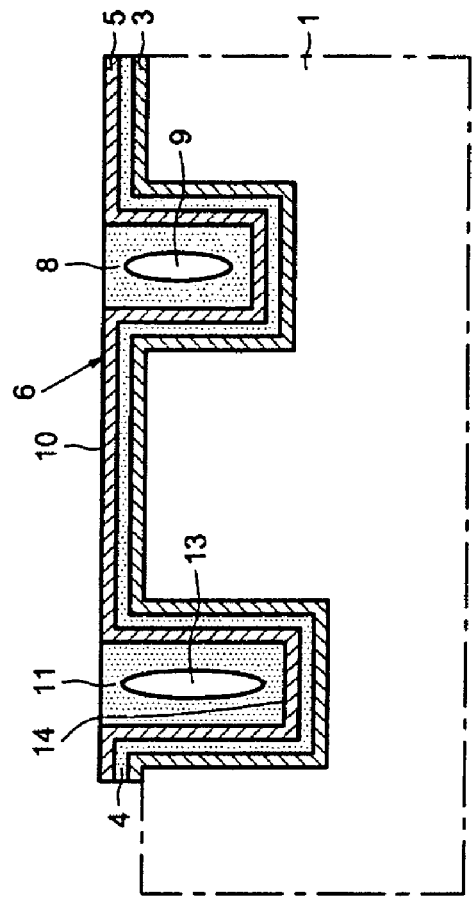

In a variant illustrated in FIGS. 11 and 12, the end of the capacitor 6 is etched by photolithographic etching.

Figure 13:
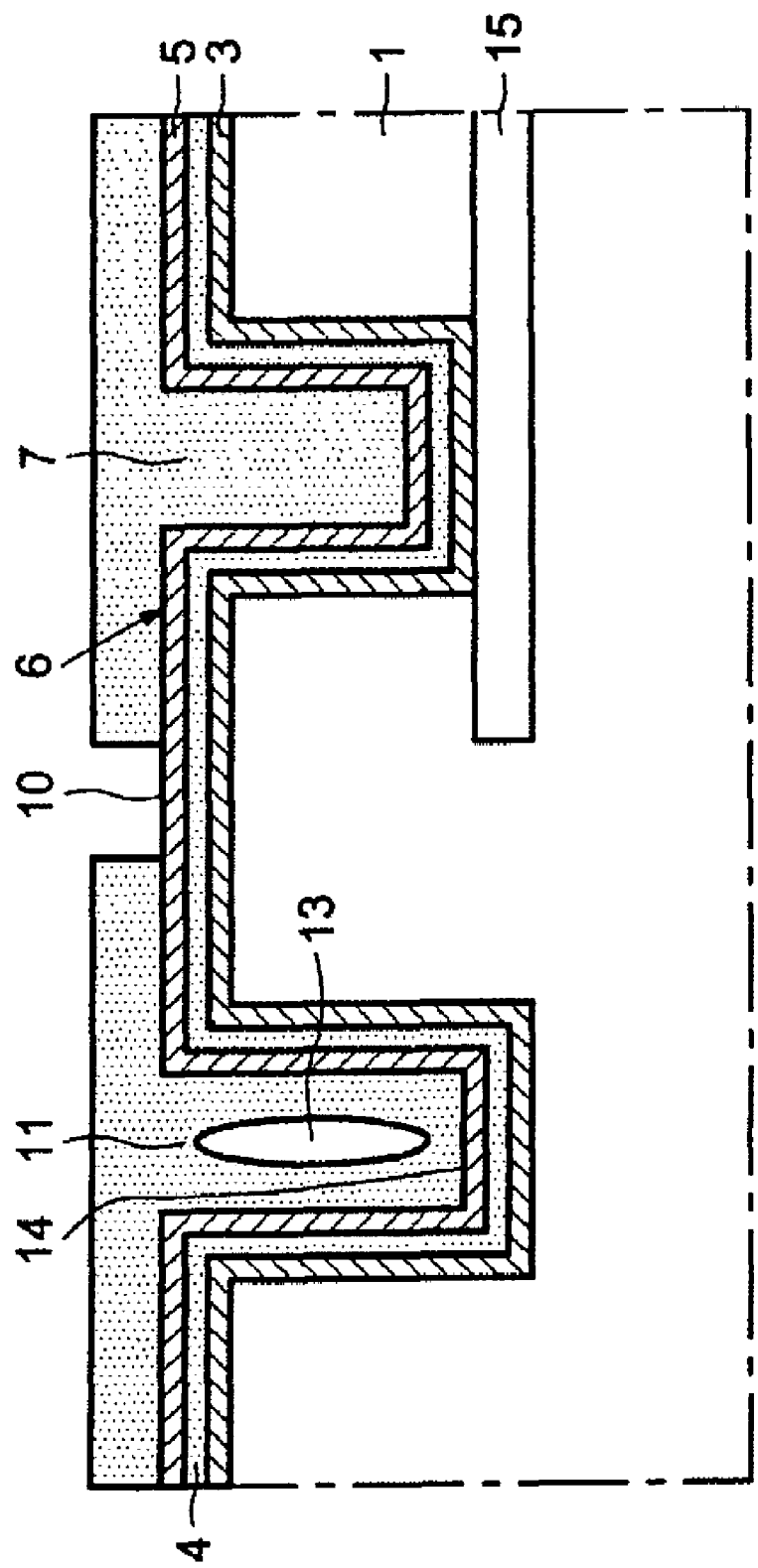

FIG. 13 illustrates the case in which an etching stop layer 15 is used to form the trench 2. The material 11 present in the additional trench 14 has an internal void 13.

Figure 14:
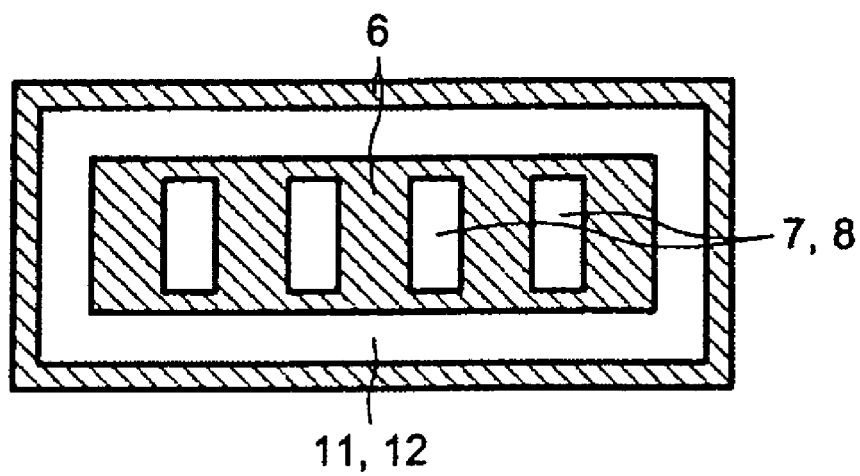

FIG. 14 illustrates the circuit, and especially the capacitor 6, seen from above. The material 11, 12 present in the additional trench 14 surrounds the assembly formed by the materials 7, 8 present in the trenches 2.

Figure 15:
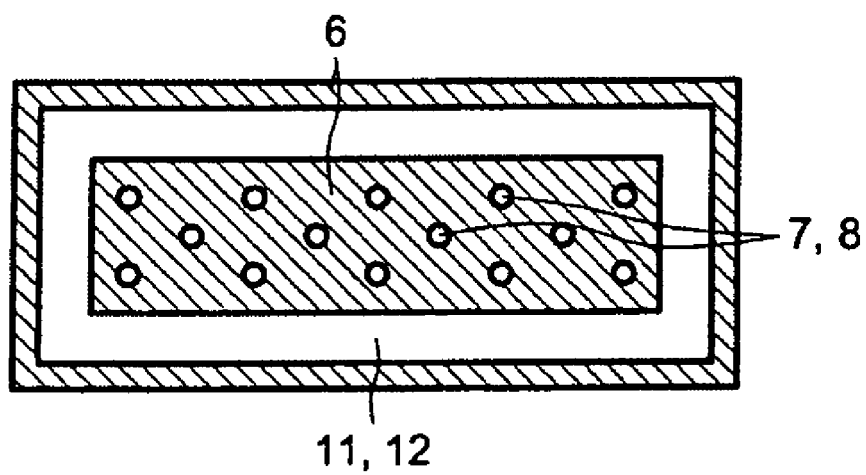

FIG. 15 illustrates a variant in which the capacitor 6 is formed in wells. The wells may be of any shape, especially circular. Preferably, the wells are placed in such a way that each well is equidistant from the neighboring wells. Such an arrangement makes it possible for a surface to have good mechanical rigidity and an optimum number of wells.

When the additional trench 14 is present, with a material 11 capable of absorbing the stresses having an internal void 13, it is found that the mean normal stress at the bottom of the trench is again further reduced relative to a tungsten material 7 not having an internal void 9 (around 98% reduction when the layer 1 is made of silicon and around 94% reduction when the layer 1 is made of silicon oxide).

Although preferred embodiments of the method and apparatus of the present invention have been illustrated in the accompanying Drawings and described in the foregoing Detailed Description, it will be understood that the invention is not limited to the embodiments disclosed, but is capable of numerous rearrangements, modifications and substitutions without departing from the spirit of the invention as set forth and defined by the following claims.

What is claimed is:

1. An integrated circuit comprising:
   at least one capacitor formed on a layer provided with at least two trenches, said capacitor including a dielectric layer that separates two conformal layer electrodes and conforms to the walls and floor of the two trenches but leaves a part of each trench behind; and
   a material which absorbs stresses that is placed in said part of each trench which is left behind;
   wherein said stress absorbing material has an internal void in at least one of the trenches having an elongated slit cross-sectional shape;
   wherein one of said two trenches is deeper than another of said two trenches; and
   wherein the another of said two trenches at least partly surrounds the one of said two trenches.

2. The integrated circuit according to claim 1, wherein said stress absorbing material is a material with a Young's modulus of less than 100 GPa.

3. The integrated circuit according to claim 1, wherein said stress absorbing material is a material selected from the group consisting of SiO$_2$, SiOC and polymers.

4. The integrated circuit according to claim 1, wherein the elongated slit cross-sectional shape of the internal void comprises a first pair of opposed curved surfaces adjacent the trench walls and a second curved surface adjacent the trench floor, the first pair of curved surfaces having a larger radius of curvature than a radius of curvature for the second curved surface.

5. The integrated circuit according to claim 1, wherein said stress absorbing material is a material selected from the group consisting of tungsten, tetraethylorthosilicate or a compound comprising tetraethylorthosilicate, SiOC and polymers.

6. The integrated circuit according to claim 1, wherein the another of said trenches also has an internal void.

7. An integrated circuit, comprising:
   a first trench having walls and a floor;
   a metal-insulator-metal layered structure deposited along and conforming to the walls and floor which leaves a part of the first trench remaining;
   a stress absorbing material with a Young's modulus of less than 100 GPa filling the remaining part of the first trench;
   a second trench at least partially surrounding the first trench;
   a stress absorbing material with a Young's modulus of less than 100 GPa filling at least part of the second trench;
   wherein the second trench is deeper than the first trench;
   wherein the stress absorbing material filling the remaining part of the first trench includes a void having an elongated slit cross-section shape which does not contact the metal-insulator-metal layered structure deposited along walls and floor of the first trench and wherein the elongated slit of the void is oriented pointing towards the floor of the trench so as to address normal stress arising from displacement of the trench walls.

8. The integrated circuit of claim 7 wherein the metal-insulator-metal layered structure is also deposited along walls and a floor of the second trench and which leaves a part of the second trench remaining, the stress absorbing material filling the remaining part of the second trench.

9. The integrated circuit of claim 8 wherein the void does not contact the metal-insulator-metal layered structure deposited along walls and a floor of the second trench.

10. The integrated circuit of claim 7 wherein the stress absorbing material filling the at least part of the second trench includes a void.

11. The integrated circuit of claim 7 wherein the first trench has a rectangular shape when viewed looking in a direction perpendicular to the floor of the first trench.

12. The integrated circuit of claim 7 wherein the first trench has a circular shape when viewed looking in a direction perpendicular to the floor of the first trench.

13. An integrated circuit, comprising:
   a plurality of trenches each having walls and a floor, a first one of trenches having a first depth and a second one of the trenches having a second depth greater than the first depth;
   a metal-insulator-metal layered structure forming a capacitor, the metal-insulator-metal layered structure deposited along and conforming to the walls and floor of each of the plurality of trenches but which leaves a part of each trench remaining;
   a stress absorbing material with a Young's modulus of less than 100 GPa filling each of the remaining parts of the plurality of trenches;
   wherein the stress absorbing material filling the remaining part of at least one of the trenches includes a void having an elongated slit cross-sectional shape which does not contact the metal-insulator-metal layered structure deposited along walls and floor of the trench and wherein the elongated slit of the void presents opposed curved surfaces adjacent the trench walls and the conforming metal-insulator-metal layered structure and which are configured to address normal stress due to displacement of the trench walls; and wherein the second one of the trenches at least partly surrounds the first one of trenches.

14. The integrated circuit of claim 13 wherein each of the trenches has a rectangular shape when viewed looking in a direction perpendicular to the floor of the trench.

15. The integrated circuit of claim 13 wherein each of the trenches has a circular shape when viewed looking in a direction perpendicular to the floor of the trench.

16. The integrated circuit of claim 13 wherein adjacent ones across the plurality of trenches are spaced equidistant from each other.

17. The integrated circuit of claim 13 wherein the stress absorbing material filling the first trench and the second trench includes a void.

18. The integrated circuit of claim 13 wherein the elongated slit further includes an additional curved surface adjacent the trench floor, and wherein the opposed curved surfaces having a larger radius of curvature than a radius of curvature for the additional curved surface.

19. The integrated circuit according to claim 1, wherein the elongated slit cross-sectional shape of said internal void has an elliptical cross-sectional shape whose major axis is generally oriented parallel to the walls of the trench.

20. The integrated circuit of claim 7 wherein the elongated slit cross-section shape of the void has an elliptical cross-section shape whose major axis is generally oriented perpendicular to the floor of the trench.

21. The integrated circuit of claim 13 wherein the slit cross-sectional shape of the void is an elliptical cross-sectional shape having a minor axis oriented generally perpendicular to the walls of the trench.

\* \* \* \* \*